(12) United States Patent
Buller et al.

(10) Patent No.: US 7,943,471 B1
(45) Date of Patent: May 17, 2011

(54) DIODE WITH ASYMMETRIC SILICON GERMANIUM ANODE

(75) Inventors: James F. Buller, Austin, TX (US); Jian Chen, Austin, TX (US)

(73) Assignee: GlobalFoundries Inc., Grand Cayman (KY)

( * ) Notice: Subject to any disclaimer, the term of this patent is extended or adjusted under 35 U.S.C. 154(b) by 248 days.

(21) Appl. No.: 11/383,295

(22) Filed: May 15, 2006

(51) Int. Cl.
*H01L 21/20* (2006.01)
(52) U.S. Cl. ............... 438/379; 438/570; 257/E21.353; 257/E29.327
(58) Field of Classification Search ............ 438/286, 438/300, 303, 427, 234, 235, 309, 312, 237, 438/91, 379, 380, 381, 570, 983, 979; 257/190, 257/369, 351, 594, 197, E21.608, E21.695, 257/183.1, E29.195, E29.327, E29.328, 480, 257/E21.353, E21.352, E21.354
See application file for complete search history.

(56) References Cited

U.S. PATENT DOCUMENTS

| | | | | | |
|---|---|---|---|---|---|
| 5,937,280 | A * | 8/1999 | Wen | | 438/130 |
| 6,943,409 | B1 * | 9/2005 | Cheng et al. | | 257/330 |
| 7,335,959 | B2 * | 2/2008 | Curello et al. | | 257/408 |
| 7,429,523 | B2 * | 9/2008 | Kocon | | 438/570 |
| 7,521,737 | B2 * | 4/2009 | Augusto | | 257/233 |
| 2001/0016380 | A1 * | 8/2001 | Watanabe et al. | | 438/237 |
| 2004/0072395 | A1 * | 4/2004 | Liu | | 438/197 |
| 2004/0084721 | A1 * | 5/2004 | Kocon et al. | | 257/328 |
| 2004/0166611 | A1 * | 8/2004 | Liu | | 438/142 |
| 2004/0188768 | A1 * | 9/2004 | Burbach et al. | | 257/369 |
| 2004/0256690 | A1 * | 12/2004 | Kocon | | 257/471 |
| 2005/0040445 | A1 * | 2/2005 | Mouli | | 257/290 |
| 2005/0053347 | A1 * | 3/2005 | West et al. | | 385/129 |
| 2005/0127275 | A1 * | 6/2005 | Yang | | 250/214 R |
| 2005/0145848 | A1 * | 7/2005 | Mouli | | 257/72 |
| 2006/0043489 | A1 * | 3/2006 | Chen et al. | | 257/355 |
| 2006/0043498 | A1 * | 3/2006 | Orlowski et al. | | 257/396 |
| 2006/0145207 | A1 * | 7/2006 | Kim et al. | | 257/292 |
| 2006/0157806 | A1 * | 7/2006 | Rhodes | | 257/414 |
| 2006/0163611 | A1 * | 7/2006 | Kawabata et al. | | 257/197 |
| 2006/0180868 | A1 * | 8/2006 | Maciejewski et al. | | 257/369 |
| 2006/0258072 | A1 * | 11/2006 | Kavalieros et al. | | 438/197 |
| 2007/0187734 | A1 * | 8/2007 | Adkisson et al. | | 257/293 |
| 2007/0210301 | A1 * | 9/2007 | Han | | 257/18 |
| 2008/0067545 | A1 * | 3/2008 | Rhee et al. | | 257/190 |
| 2008/0128746 | A1 * | 6/2008 | Wang | | 257/190 |

* cited by examiner

*Primary Examiner* — Matthew C Landau
*Assistant Examiner* — Latanya Crawford
(74) *Attorney, Agent, or Firm* — Williams, Morgan & Amerson, P.C.

(57) ABSTRACT

The present invention is directed to a diode with an asymmetric silicon germanium anode and methods of making same. In one illustrative embodiment, the diode includes an anode comprising a P-doped silicon germanium material formed in a semiconducting substrate, an N-doped silicon cathode formed in the semiconducting substrate, a first conductive contact that is conductively coupled to the anode and a second conductive contact that is conductively coupled to the cathode.

37 Claims, 7 Drawing Sheets

DIODE WITH ASYMMETRIC SILICON GERMANIUM ANODE

BACKGROUND OF THE INVENTION

1. Field of the Invention

The present invention is generally directed to the field of semiconductor devices, and, more particularly, to a diode with an asymmetric silicon germanium anode and methods of making same.

2. Description of the Related Art

Diodes are a very common device found in many integrated circuits. The main characteristic of a diode is that it conducts electricity in only one direction. Diodes are used in both DC (direct current) and AC (alternating current) circuits. For example, in AC circuits, diodes may be employed to rectify an AC signal. In general, a diode conducts current when it is forward biased. The voltage level at which a diode is forward biased is sometimes referred to as the forward voltage of the diode. In a simplified sense, the forward voltage is the voltage level at which the diode is turned "on."

Power consumption is typically an issue in many, if not all, integrated circuit applications. With respect to the operation of a diode, the greater the forward voltage, the more power consumed by the device. Additionally, all other things being equal, the greater the forward voltage of a diode, the more time it will take to become forward biased. In turn, such delays can have adverse impacts on the design of high speed AC circuits and devices incorporating such circuitry.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a diode with an asymmetric silicon germanium anode and methods of making same. In one illustrative embodiment, the diode comprises an anode comprising a P-doped silicon germanium material formed in a semiconducting substrate, an N-doped silicon cathode formed in the semiconducting substrate, a first conductive contact that is conductively coupled to the anode and a second conductive contact that is conductively coupled to the cathode.

In another illustrative embodiment, the diode is formed in an SOI substrate, the SOI substrate comprising an active layer, the diode comprising an anode formed in the active layer, the anode comprising a P-doped silicon germanium material, an N-doped silicon germanium material formed in the active layer adjacent the P-doped silicon germanium material, an N-doped silicon cathode formed in the active layer, a first conductive contact that is conductively coupled to the anode and a second conductive contact that is conductively coupled to the cathode.

In yet another illustrative embodiment, the diode comprises an anode formed in a bulk semiconducting substrate, the anode comprising an N-doped layer of silicon germanium material and a P-doped layer of silicon material formed above the N-doped layer of silicon germanium material, an N-doped silicon cathode formed in the bulk semiconducting substrate, an isolation structure formed in the bulk semiconducting substrate between the anode and the cathode, a first conductive contact that is conductively coupled to the anode, and a second conductive contact that is conductively coupled to the cathode.

In one illustrative embodiment, the method comprises etching a trench into a semiconducting substrate, forming a P-doped anode by forming at least a P-doped layer of silicon germanium material in the trench, forming an N-doped silicon cathode in the semiconducting substrate and forming a conductive contact to each of the anode and cathode.

In another illustrative embodiment, the method comprises performing a first etching process to etch a trench into a semiconducting substrate, performing a first epitaxial growth process to form a layer of N-doped silicon germanium material in the trench, forming a mask over a covered portion of the N-doped layer of silicon germanium material, performing a second etching process to remove exposed portions of the N-doped layer of silicon germanium material from the trench and leave the covered portion of the N-doped layer of silicon germanium material in the trench, forming an anode by performing a second epitaxial growth process to form a layer of silicon germanium material in the trench adjacent the covered portion of the layer of N-doped silicon germanium material in the trench, forming an N-doped silicon cathode in the semiconducting substrate and forming a conductive contact to each of the anode and cathode.

In a further illustrative embodiment, a method of forming a diode in an SOI substrate comprising an active layer is disclosed, the method comprising forming an isolation structure in the active layer, forming a masking structure above the active layer, etching a trench into the active layer between the masking structure and the isolation structure, forming an anode by forming a layer of N-doped silicon germanium material in the trench and forming a P-doped layer of silicon germanium material in the trench adjacent the N-doped silicon germanium material, forming an N-doped silicon cathode in the active layer and forming a conductive contact to each of the anode and cathode.

In yet a further illustrative embodiment, a method of forming a diode in a bulk semiconducting substrate is disclosed, the method comprising forming an N-well in the bulk semiconducting substrate, forming an isolation structure in the bulk semiconducting substrate in an area within the N-well, etching a trench into the bulk semiconducting substrate adjacent the isolation structure, forming an anode by forming an N-doped layer of silicon germanium material in the trench and forming a P-doped layer of silicon germanium material above the N-doped layer of silicon germanium material, forming an N-doped silicon cathode in the bulk semiconducting substrate adjacent the isolation structure in an area within the N-well and forming a conductive contact to each of the anode and cathode.

BRIEF DESCRIPTION OF THE DRAWINGS

The invention may be understood by reference to the following description taken in conjunction with the accompanying drawings, in which like reference numerals identify like elements, and in which.

Figure 1:
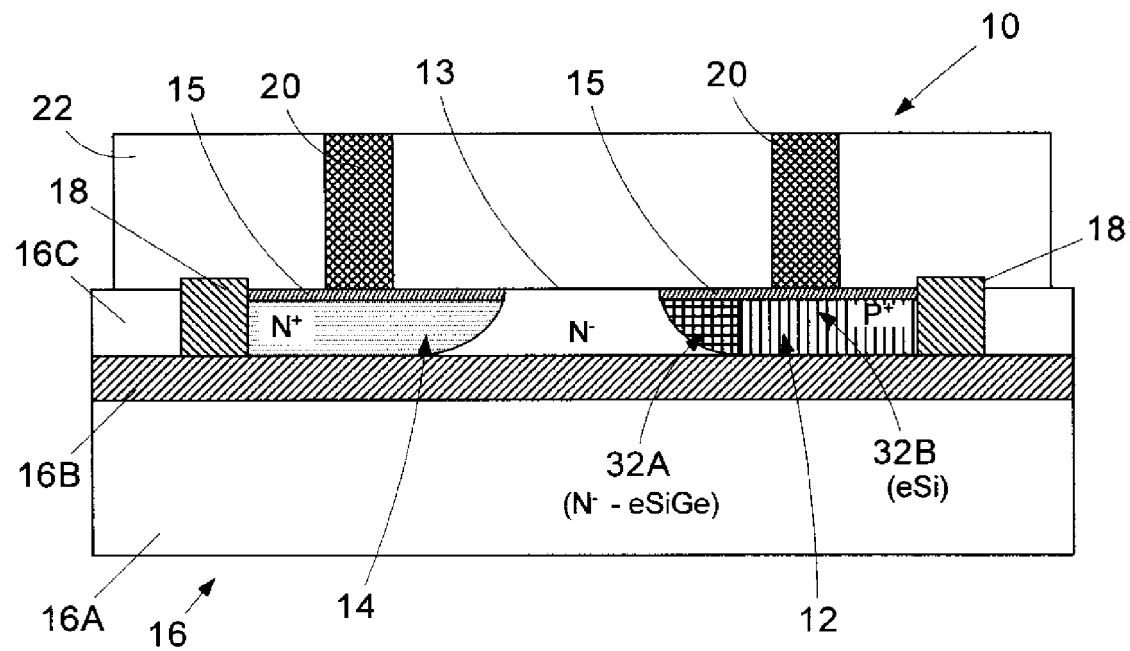
FIG. 1 is a cross-sectional side view of an illustrative embodiment of a diode in accordance with one aspect of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 depicts one illustrative embodiment of the diode disclosed herein. As shown therein, the diode 10 comprises an anode 12 and a cathode 14. In the illustrative embodiment depicted in FIG. 1, the diode 10 is formed in a silicon-on-insulator (SOI) substrate 16 comprised of a bulk substrate 16A, a buried insulation layer 16B (sometimes referred to as a "BOX" layer), and an active layer 16C. A trench isolation structure 18 may be employed to electrically isolate the diode 10 from other semiconductor devices. Also depicted in FIG. 1 are illustrative metal silicide regions 15 and illustrative conductive contacts 20 that are positioned in a layer of insulating material 22. The conductive contacts 20 are conductively coupled to the anode 12 and cathode 14, as depicted in FIG. 1.

In one illustrative embodiment, the anode 12 is comprised of an N-doped silicon germanium material 32A and a P-doped epitaxial silicon material 32B. In one particular embodiment, the anode is comprised of an epitaxially grown layer of silicon germanium. The N-doped epitaxial silicon material 32A may have an N-type dopant concentration ranging from approximately 1E16-3E18 ions/cm$^3$. Any of a variety of different N-type dopant materials may be employed. The P-doped epitaxial silicon material 32B may have a P-type dopant concentration ranging from approximately 1E19-5E20 ions/cm$^3$. Any of a variety of different P-type dopant materials may be employed.

The cathode 14 is an N'-doped region of the active layer 16C. In one illustrative embodiment, the cathode 14 may have an N-type dopant concentration ranging from approximately 1E19-5E20 ions/cm$^3$. Any of a variety of different N-type dopant materials may be employed. The active layer 16C has an N$^-$ dopant concentration. In one illustrative embodiment, the active layer 16C may have an N-type dopant concentration ranging from approximately 1E16-3E18 ions/cm$^3$. Any of a variety of different N-type dopant materials may be employed.

The illustrative diode depicted in FIG. 1 is formed on the SOI substrate 16. However, after a complete reading of the present application, those skilled in the art will appreciate that the diode 10 disclosed herein may be employed on different types of semiconducting substrates, e.g., bulk silicon substrates.

Figure 2:
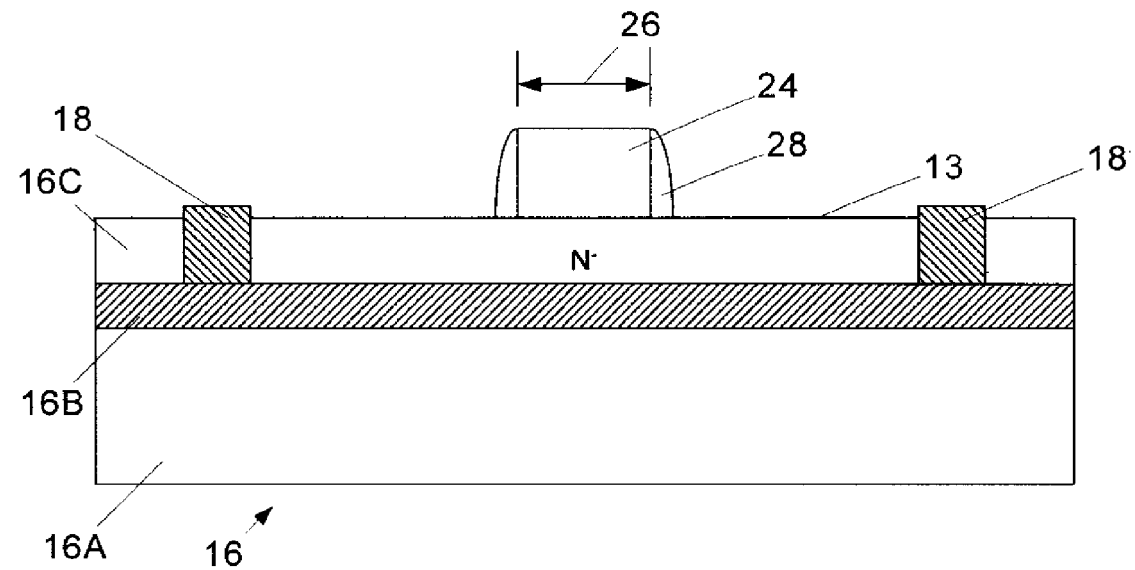
FIG. 2 is a cross-sectional side view depicting an early stage of manufacture of an illustrative diode in accordance with one illustrative embodiment of the present invention.

FIGS. 2-8 depict one illustrative process flow for forming the illustrative diode 10 depicted herein. As shown in FIG. 2, the isolation region 18 may be formed in the active layer 16C by performing known etching and deposition techniques. Also depicted in FIG. 2 is an illustrative masking structure 24 having a width 26. A sidewall spacer 28 is also depicted adjacent the masking structure 24.

In general, the purpose of the masking structure 24 is to prevent the formation of a metal silicide on covered portions of the surface 13 of the active layer 16C so as to prevent the creation of a short circuit path between the anode 12 and cathode 14. The masking structure 24 may or may not remain in place on the finished diode 10. In the illustrative embodiment depicted in FIG. 1, the masking structure 24 has been removed.

The masking structure 24 may be comprised of any material that is sufficient to perform the masking functions described above. In one illustrative embodiment, the masking structure 24 may be a gate electrode type structure that may be formed at the same time gate electrode structures are formed for various transistor devices (not shown) that are also formed on the SOI substrate 16. For example, the masking structure 24 may be comprised of polysilicon and it may be formed by performing known deposition and etching processes. The width 26 of the masking structure 24 may vary depending upon a particular application. Typically, the width 26 may be 2-3 times greater than the gate length of the transistors (not shown) formed on the device. Thus, for example, if the gate length of the transistors is approximately 50-90 nm, the width 26 of the masking structure 24 may be approximately 100-270 nm.

The sidewall spacer 28 may be comprised of a variety of materials and may be formed using a variety of known techniques. For example, the spacer 28 may be formed by conformally depositing a layer of spacer material, e.g., silicon dioxide, silicon nitride, and thereafter performing an anisotropic etching process. In one illustrative process flow, the sidewall spacer 28 is employed to protect the masking structure 24 during a subsequent etching process performed in forming the anode 12, as described more fully below. The sidewall spacer 28 may be sacrificial or permanent as described more fully below.

Figure 3:
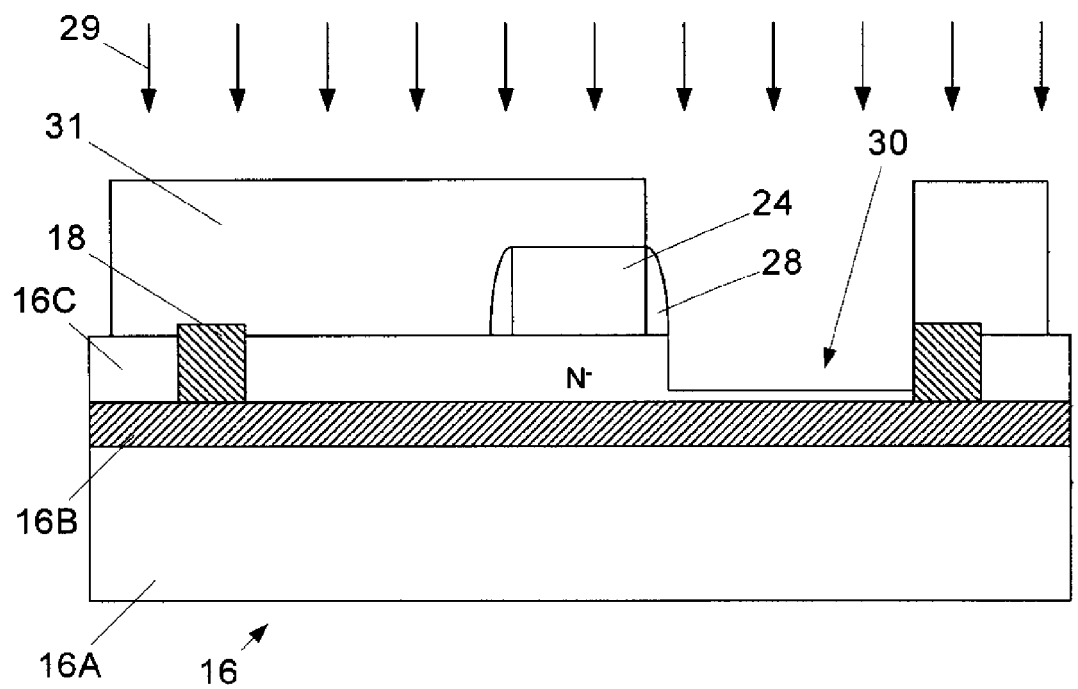
FIG. 3 is a view of the device depicted in FIG. 2 having a trench formed therein for the anode of the illustrative diode depicted herein.

FIG. 3 depicts the device shown in FIG. 2 after an etching process 29 is performed to form a trench 30 in the active layer 16C between the isolation structure 18 and the masking structure 24. In some cases, the spacer 28 may or may not be present. Thus, when it is stated that the trench 30 is formed between the isolation structure 18 and the masking structure 24, it is to be understood that the masking structure 24 may or may not have the spacer 28. A masking layer 31, e.g., photoresist, is employed during the etching process 29 to protect the remainder of the substrate 16. The sidewall spacer 28 protects the masking structure 24 during the etching process 29. In the particular embodiment depicted herein, the trench 30 is self-aligned with respect to the sidewall spacer 28. Typically, the trench 30 does not extend all the way to the buried insulation layer 16B. The portion of the active layer 16C remaining in the trench 30 can serve as a seed layer for a subsequent epitaxial growth process to be described more fully below. In one illustrative embodiment, the trench 30 may have a depth ranging from approximately 100-2000 Å.

Figure 4:
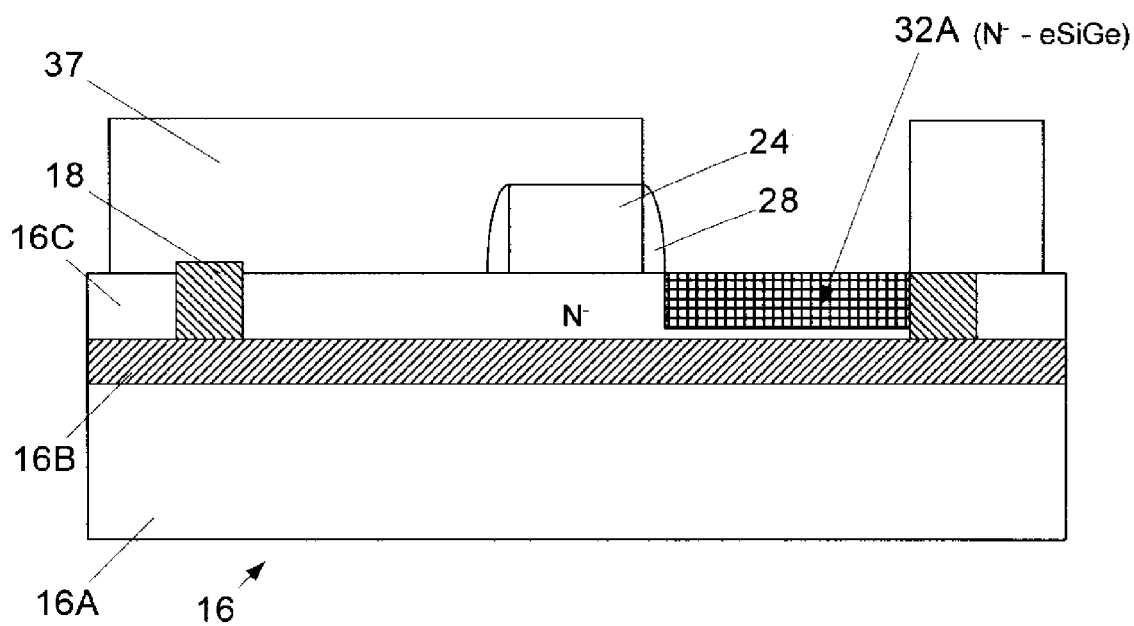
FIG. 4 is a view of the device depicted in FIG. 3 after a doped layer of epitaxially grown silicon germanium is formed in the trench for the anode.

Next, as shown in FIG. 4, in one illustrative embodiment, an N-doped layer of epitaxial silicon 32A is grown in the trench 30. The N-doped epitaxial silicon 32A may be grown using known processing techniques and known epi-deposition tools. A hard mask layer 37 is formed above the substrate 16 during the epitaxial growth process. The hard mask material may be comprised of the same materials as the spacer 28.

In accordance with one aspect of the present invention, germanium is introduced into the epitaxial layer of silicon 32A by introducing germanium during the epitaxial growth process. The concentration of the germanium may vary depending upon the particular application. For example, the concentration of germanium in the final anode structure 12 may comprise approximately 10-25%. The germanium in the layer 32A acts to reduce the effective bandgap of the silicon, thereby lowering the forward voltage of the diode 10.

Figure 5:
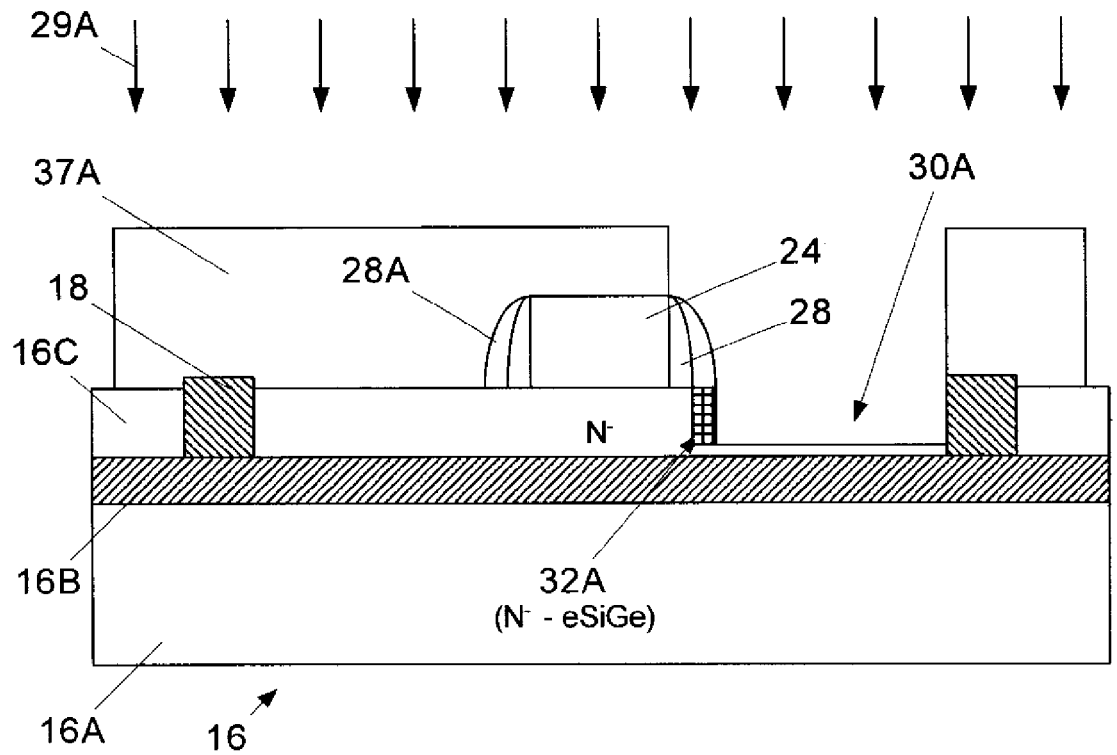
FIG. 5 is a view of the device depicted in FIG. 4 after another process is performed on a portion of the doped silicon germanium material formed in the trench.

Next, as shown in FIG. 5, the hard mask layer 37 (see FIG. 4) may be removed, and a second sidewall spacer 28A may be formed adjacent the spacer 28. The spacer 28A may be formed using traditional deposition or anisotropic etching techniques well known to those skilled in the art. A subsequent masking layer 37A may then be formed above the structure depicted in FIG. 5. An etching process 29A may then be performed to form the trench 30A. In some embodiments, the masking layer 37A may be a hard mask layer that is able to withstand the processing temperatures associated with a subsequent epitaxial growth process. In some cases, the masking layer 37A may be a layer of photoresist material that is removed after the etching process 29A is performed. A separate hard mask layer may then be formed for use in the subsequent epitaxial growth process. For purposes of explanation, it will be assumed that the masking layer 37A is a hard mask layer, e.g., silicon nitride, that may be used in both the etching process 29A and the subsequent epitaxial growth process.

Figure 6:
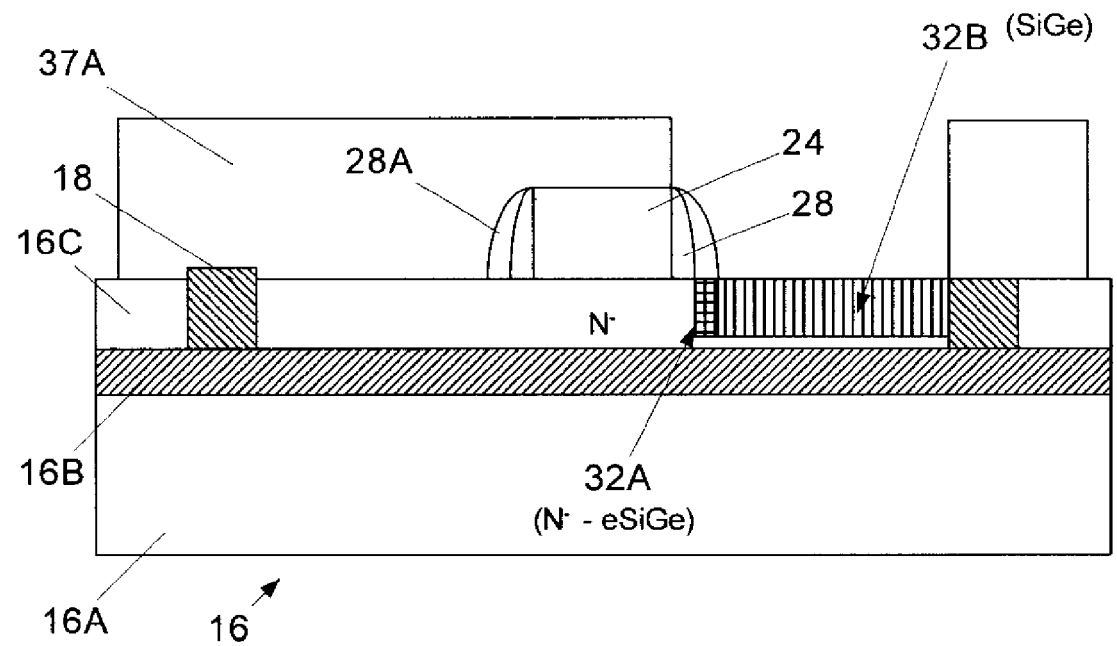
FIG. 6 is a view of the device depicted in FIG. 5 after a layer of epitaxially grown silicon germanium is formed in the trench.

The etching process 29A removes a portion of the epi material 32A not covered by the spacers 28, 28A and the masking layer 37A. Next, as shown in FIG. 6, the trench 30A is filled with undoped epitaxially grown silicon germanium (eSiGe) 32B. Note that the width of the N-doped epi material 32A is substantially less than the width of the undoped epitaxially grown silicon germanium 32B.

Figure 7:
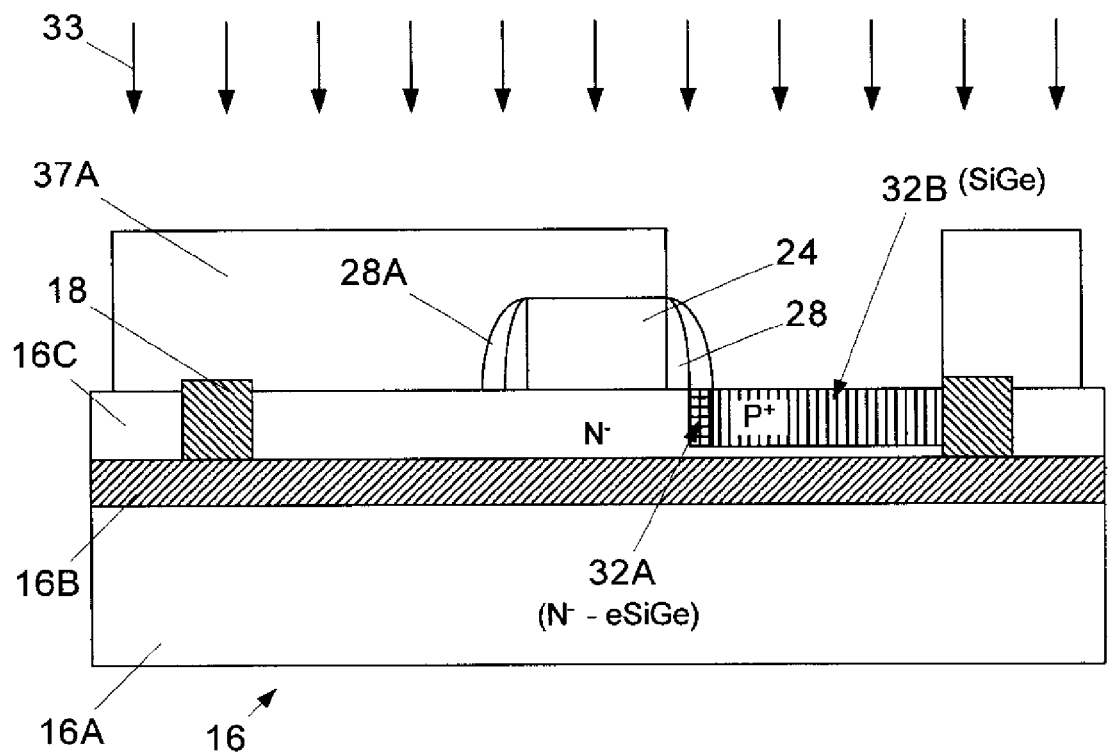
FIG. 7 is a view of the device depicted in FIG. 6 wherein dopant materials are implanted to form the anode of the illustrative diode depicted herein.
Figure 8:
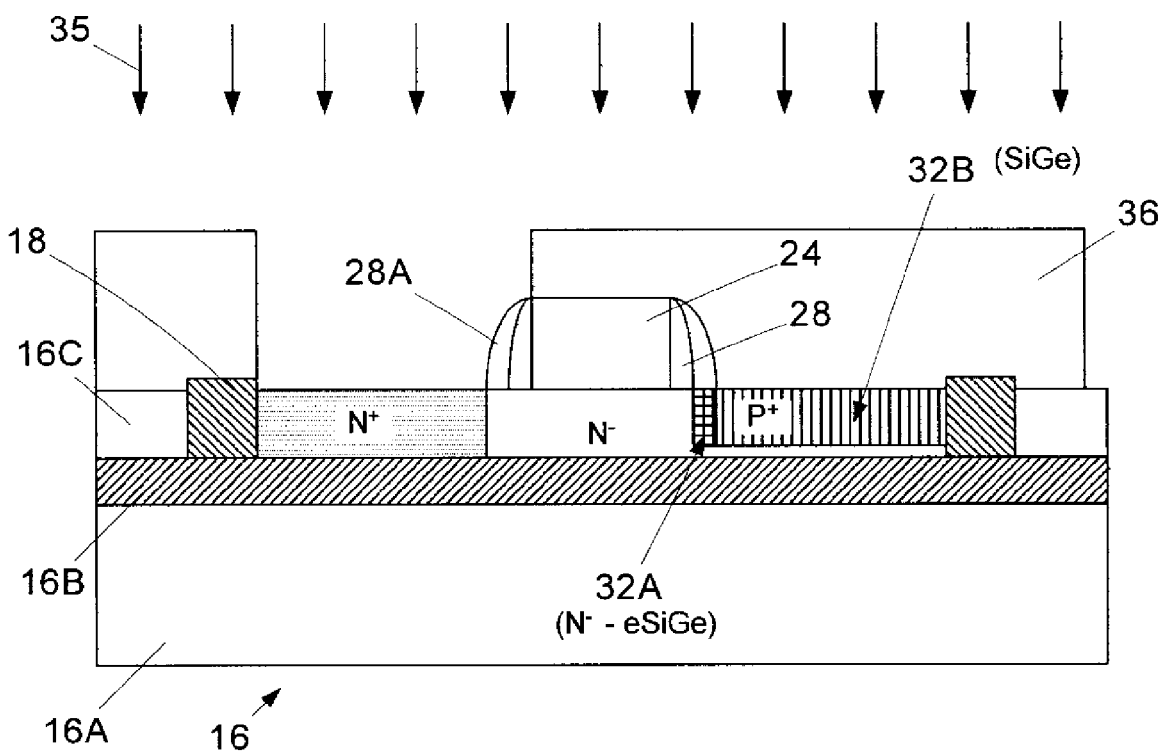
FIG. 8 is a view of the device depicted in FIG. 7 wherein dopant materials are implanted to form the cathode of the illustrative diode depicted herein.

Next, as shown in FIGS. 7 and 8, one or more ion implant processes may be performed to introduce dopant materials into the active layer 16C and silicon germanium layer 32B to thereby complete the formation of the anode 12 and cathode 14. Prior to performing these implant processes, the spacers 28, 28A may or may not be removed. It should be understood that the spacers 28, 28A are schematic in nature as they may represent one or more spacers that are formed prior to or during the various ion implant processes performed to form the anode 12 and cathode 14.

As shown in FIG. 7, an ion implant process 33 is performed to introduce a P-type dopant material into the undoped silicon germanium layer 32B. Illustrative P-type dopant materials include, for example, boron, boron difluoride, etc. The implant process 33 may be performed at a dopant dose ranging from approximately 5E14-8E15 ions/cm$^2$ and at an energy level ranging from approximately 1-20 keV.

Next, as shown in FIG. 8, the masking layer 37A may be removed and a new implant mask 36 may be formed to expose the region of the active layer 16C that will constitute the cathode 14. An ion implant process 35 is performed to implant an N-type dopant material, such as, e.g., arsenic or phosphorous, at a dopant dose ranging from approximately 5E14-1E16 ions/cm$^2$ at an energy level of approximately 1-20 keV. Of course, the order of the implant processes 33, 35 may be reversed if desired.

Thereafter, known processing techniques may be employed to complete the formation of the diode 10. For example, one or more heat treatment processes may be performed to activate the implanted dopant material and repair any damage to the lattice structure. If desired, metal silicide regions 15 may be formed on the surface 13 of the active layer 16C above the anode 12 and cathode 14 as shown in FIG. 1 using known techniques. The masking structure 24 protects the covered portion of the surface 13 during any such silicidation process. As mentioned previously, the masking structure 24 may be removed if desired. It should be noted that the diode depicted in FIG. 1 is depicted after various heat treatments have been performed to thereby cause the implanted dopant material to migrate somewhat under the masking structure 24.

Figure 9:
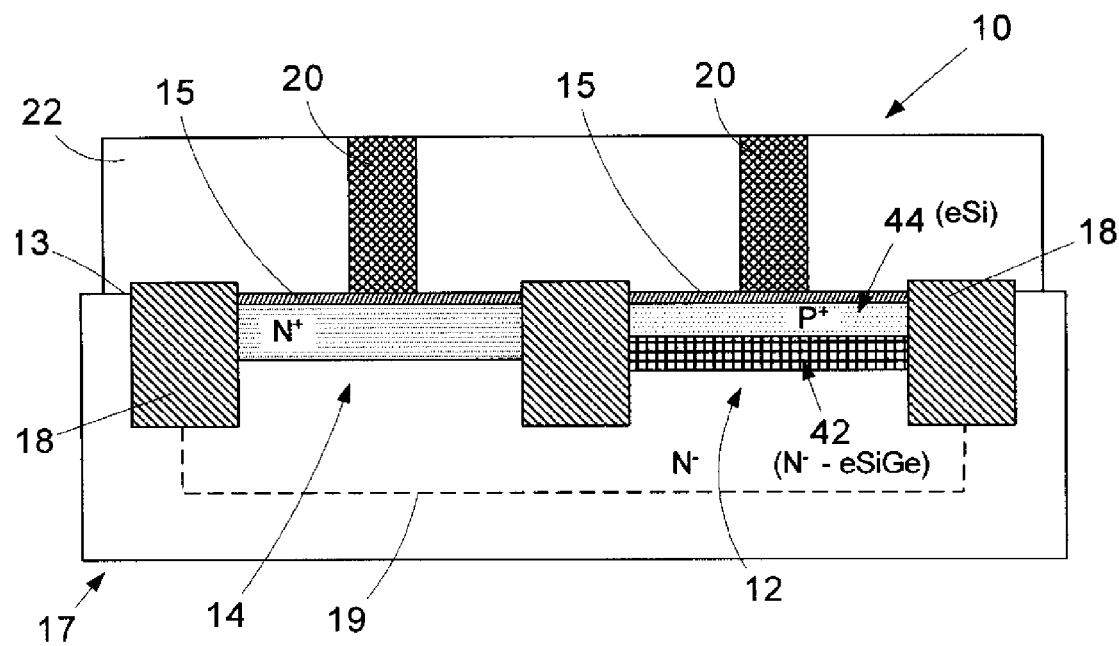
FIG. 9 is an illustrative depiction of the diode described herein formed in a bulk silicon substrate.
Figure 10:
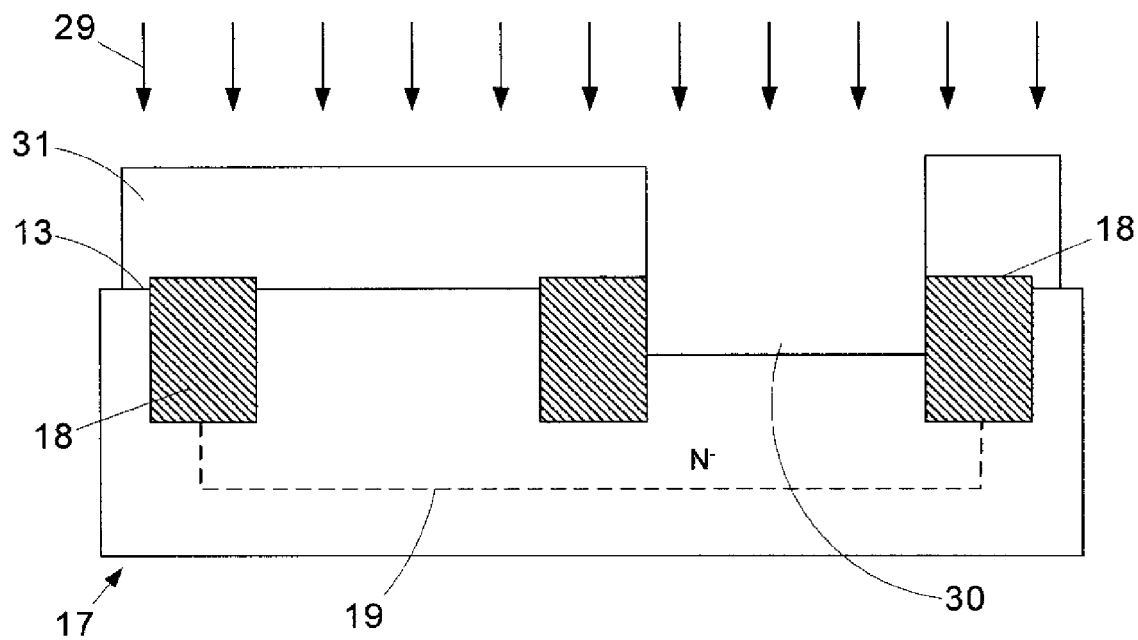
FIG. 10 depicts the device shown in FIG. 9 at an initial stage of fabrication.

FIGS. 9-14 depict another illustrative embodiment of the diode 10 formed in a traditional bulk silicon substrate 17. In discussing this embodiment, like reference numerals will be used to discuss previously described structures and processes. As seen in FIG. 9, the diode 10 is comprised of an anode 12 and cathode 14. The anode 12 is comprised of a P⁺-doped epitaxial silicon layer 44 positioned above an N-doped layer of epitaxial silicon germanium 42. The cathode 14 is comprised of an N⁺-doped silicon material. The diode 10 is formed in an N⁻ well 19 formed in the substrate 17. In one embodiment, the isolation regions 18 may have a depth of approximately 3000-5000 Å and a width of approximately 2000-4000 Å.

FIGS. 10-14 depict one illustrative process flow for forming the diode 10 depicted in FIG. 9. Initially, the N⁻ well 19 may be formed by performing known ion implantation techniques. In one illustrative embodiment, the N⁻ well 19 may have a dopant concentration ranging from approximately 1E16-3E18 ions/cm³. Any of a variety of different N⁻-type dopant materials may be employed. The masking layer 31 may be formed to expose a portion of the surface 13 of the substrate 17 where the anode 12 will be formed. The previously described etching process 29 may be performed to form the trench 30 in the substrate 17. The depth of the trench 30 may range from approximately 1000-5000 Å.

Figure 11:
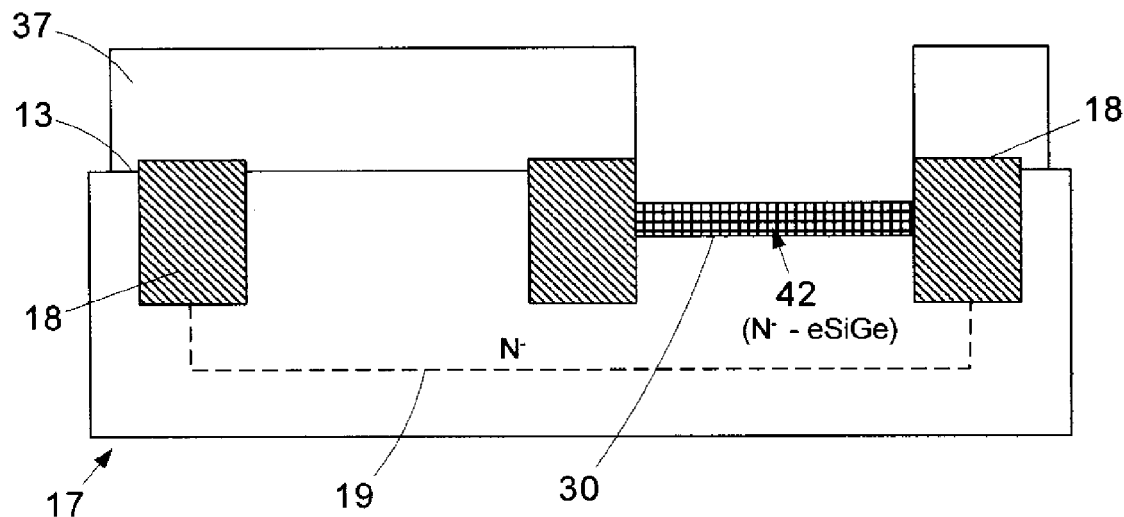
FIG. 11 depicts the device shown in FIG. 10 after a first layer of doped epitaxial silicon has been formed.

Thereafter, as shown in FIG. 11, a hard mask layer 37 is formed above the substrate 17 so as to expose the trench 30. An epitaxial growth process is performed to form the N-doped layer of epitaxial silicon germanium 42. The layer 42 does not completely fill the trench 30. In some embodiments, the layer 42 may have a thickness that is approximately one-half of the depth of the trench 30, although that may vary depending upon the application. In absolute terms, the layer 42 may have a thickness ranging from approximately 200-2000 Å. The concentration of the N-type dopant material in the layer 42 may vary from approximately 1E16-3E18 ions/cm³. In one illustrative embodiment, the concentration of N-type dopant material in the layer 42 may be approximately the same as the concentration of N-type dopant material in the N-well 19.

As with the previous embodiment, germanium may be introduced into the layer of epitaxial silicon 42 by introducing germanium during the epi growth process. The concentration of the germanium may be approximately 10-25%. In one particularly illustrative embodiment, both the N-type dopant and germanium are introduced during the epitaxial growth process that is performed to form the layer 42.

Figure 12:
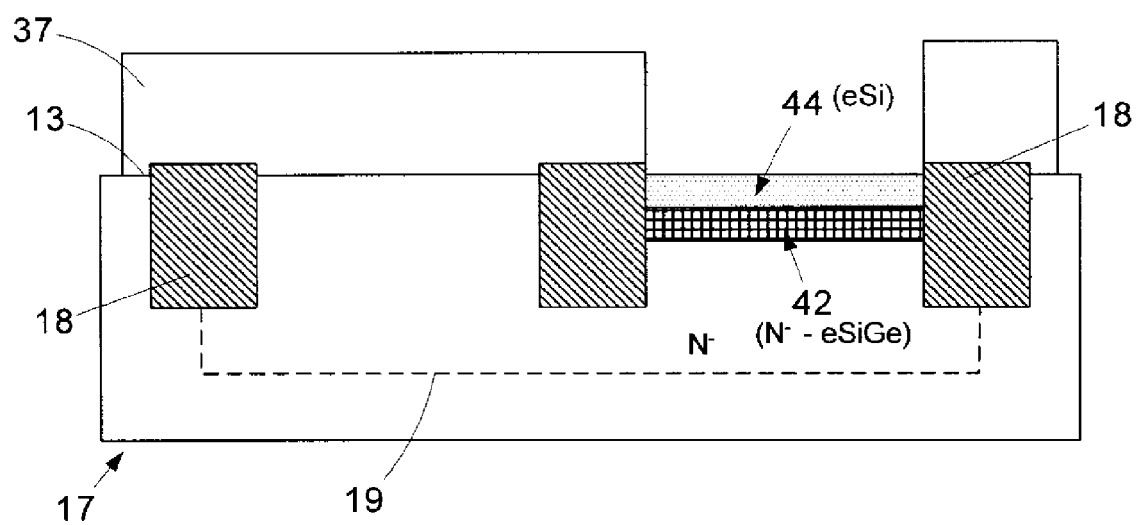
FIG. 12 is a view of the device shown in FIG. 11 after a second layer of epitaxial silicon is formed above the first layer of epitaxial silicon.

Next, as shown in FIG. 12, a layer 44 of epitaxial silicon (eSi) or epitaxial silicon germanium (eSiGe) is formed above the layer 42. The layer 44 fills the portion of the trench 30 not filled by the layer 42. In one illustrative embodiment, the layer 44 may have a thickness ranging from approximately 200-2000 Å. In one particularly illustrative embodiment, where the layer 44 comprises eSi, after the epitaxial growth process is performed for a sufficient time to form the layer 42, the flow of source gases for the germanium and the N-type dopant material may be stopped. The epitaxial growth process may then be continued to grow the layer of epitaxial silicon (eSi) 44.

Figure 13:
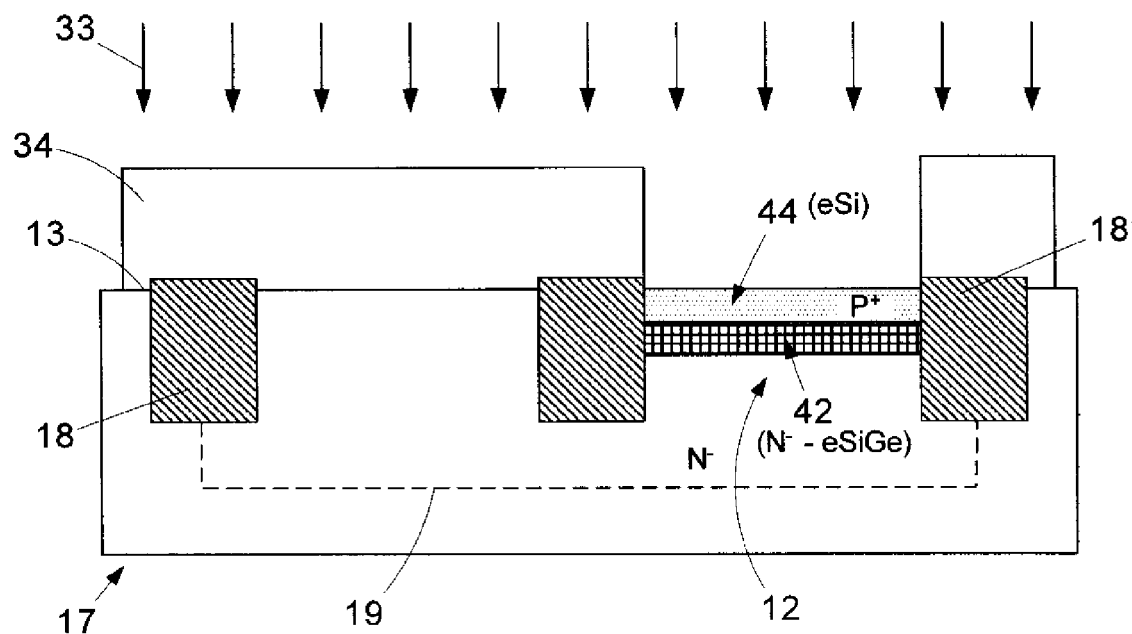
FIG. 13 depicts an illustrative ion implant process performed to introduce a P-type dopant material into the anode.
Figure 14:
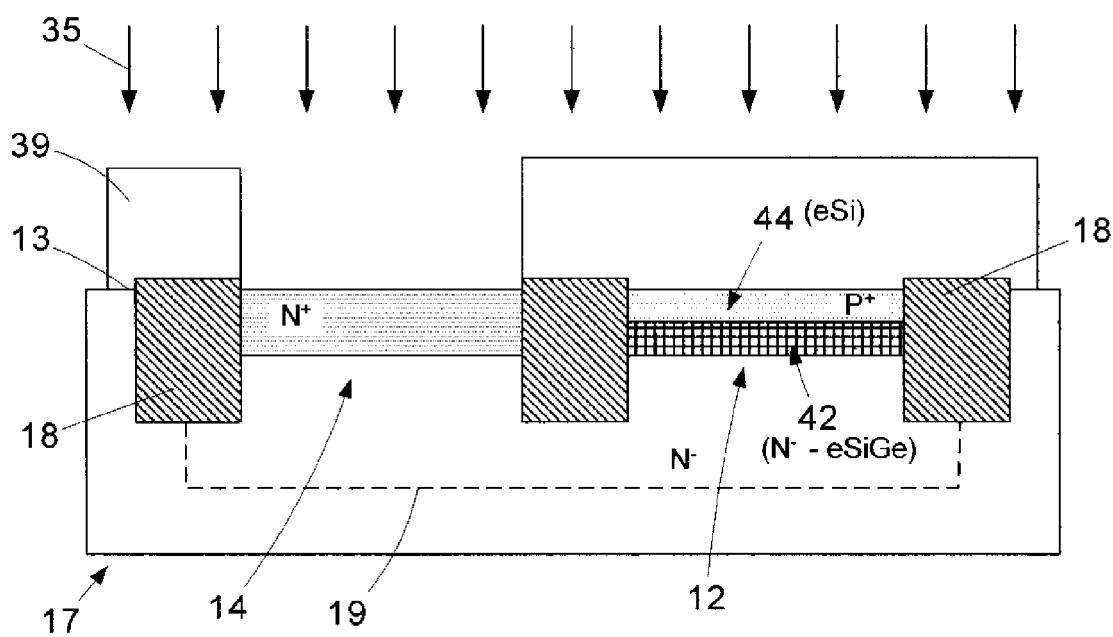
FIG. 14 depicts an illustrative ion implant process performed to introduce an N-type dopant material into the cathode.

Then, as shown in FIG. 13, a P-type dopant material is introduced into the epitaxial silicon layer 44 by performing an ion implant process 33 through the masking layer 39. Lastly, as shown in FIG. 14, a masking layer 36 is formed above the substrate 17, and an N-type dopant material is introduced by the implant process 35 to form the cathode 14. As with the previous embodiments, additional processing steps may be performed to complete the formation of the diode depicted in FIG. 9.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a diode, comprising:
   etching a trench into a semiconducting substrate;
   forming a P-doped anode by forming at least an N-type portion of silicon germanium material in said trench and forming a P-doped portion comprising silicon in said trench;
   forming an N-doped silicon cathode in said semiconducting substrate, wherein the n-type portion of the anode contacts the substrate in a region not including the n-doped silicon cathode and
   forming a conductive contact to each of said anode and cathode.

2. The method of claim 1, further comprising forming a metal silicide layer on each of said anode and cathode prior to forming said conductive contacts.

3. The method of claim 1, wherein forming said N-type portion of silicon germanium material in said trench comprises performing an epitaxial growth process to epitaxially grow a layer of silicon germanium in said trench while introducing an N-type dopant during said epitaxial growth process.

4. The method of claim 1, wherein forming said N-type layer of silicon germanium material comprises performing an epitaxial growth process to form a layer of epitaxially grown silicon germanium material and thereafter performing an ion implantation process to introduce an N-type dopant material into said epitaxially grown layer of silicon germanium material.

5. The method of claim 1, wherein forming an N-doped silicon cathode in said active layer comprises performing at least one ion implantation process with an N-type dopant material to form said N-doped silicon cathode.

6. The method of claim 1, wherein forming said N-type portion of silicon germanium material in said trench comprises forming said N-type portion of silicon germanium material comprising approximately 10-25% germanium in said trench.

7. The method of claim 1, wherein said N-type portion of silicon germanium material has a dopant concentration of approximately 1E16-3E18 ions/cm3.

8. The method of claim 1, wherein the P-doped portion comprises silicon germanium.

9. The method of claim 1, wherein forming said P-doped portion comprising silicon in said trench comprises performing an epitaxial growth process to epitaxially grow a layer of silicon in said trench while introducing a P-type dopant during said epitaxial growth process.

10. The method of claim 1, wherein forming said P-doped portion comprising silicon comprises performing an epitaxial growth process to form a layer of epitaxially grown silicon material and thereafter performing an ion implantation process to introduce a P-type dopant material into said epitaxially grown layer of silicon germanium material.

11. The method of claim 1, wherein said P-doped portion comprising silicon has a dopant concentration of approximately 1E19-5E20 ions/cm3.

12. The method of claim 8, wherein forming said P-doped portion comprising silicon germanium in said trench comprises forming said P-doped portion comprising approximately 10-25% germanium in said trench.

13. A method of forming a diode, comprising:
performing a first etching process to etch a trench into a semiconducting substrate;
performing a first epitaxial growth process to form a layer of N-doped silicon germanium material in said trench;
forming a mask over a covered portion of said N-doped layer of silicon germanium material;
performing a second etching process to remove exposed portions of said N-doped layer of silicon germanium material from said trench and leave said covered portion of said N-doped layer of silicon germanium material in said trench;
forming an anode by performing a second epitaxial growth process to form a layer of silicon germanium material in said trench adjacent said covered portion of said layer of N-doped silicon germanium material in said trench;
forming an N-doped silicon cathode in said semiconducting substrate; and
forming a conductive contact to each of said anode and cathode.

14. The method of claim 13, further comprising forming a metal silicide layer on each of said anode and cathode prior to forming said conductive contacts.

15. The method of claim 13, wherein said N-doped layer of silicon germanium material has a thickness that is less than a depth of said trench.

16. The method of claim 13, wherein forming said N-doped silicon cathode in said active layer comprises performing at least one ion implantation process with an N-type dopant material to form said N-doped silicon cathode.

17. The method of claim 13, wherein forming said N-doped layer of silicon germanium material in said trench comprises forming said N-doped silicon germanium material comprising approximately 10-25% germanium in said trench.

18. The method of claim 13, wherein said N-doped layer of silicon germanium material has a dopant concentration of approximately 1E16-3E18 ions/cm3.

19. The method of claim 13, further comprising performing an ion implantation process to introduce a P-type dopant material into said layer of epitaxial silicon germanium material formed during said second epitaxial growth process.

20. The method of claim 13, wherein said layer of silicon germanium material in said trench adjacent said covered portion of said layer of N-doped silicon germanium material comprises a P-doped layer of silicon germanium.

21. The method of claim 13, wherein said layer of silicon germanium material in said trench adjacent said covered portion of said layer of N-type silicon germanium material comprises approximately 10-25% germanium.

22. The method of claim 20, wherein said P-doped layer of silicon germanium material in said trench adjacent said covered portion of said layer of N-doped silicon germanium material has a dopant concentration of approximately 1E19-5E20 ions/cm3.

23. A method of forming a diode in an SOI substrate comprising an active layer, the method comprising:
forming an isolation structure in said active layer;
forming a masking structure above said active layer;
etching a trench into said active layer between said masking structure and said isolation structure;
forming an anode by:
forming a layer of N-type silicon germanium material in said trench; and
forming a P-doped layer comprising silicon material in said trench adjacent said N-type silicon germanium material;
forming an N-doped silicon cathode in said active layer; and
forming a conductive contact to each of said anode and cathode.

24. The method of claim 23, further comprising forming a metal silicide layer on each of said anode and cathode prior to forming said conductive contacts.

25. The method of claim 23, wherein forming said N-type layer of silicon germanium material in said trench comprises epitaxially growing a layer of silicon germanium material in said trench.

26. The method of claim 23, wherein said P-doped layer of silicon material comprises a layer of epitaxially grown silicon material.

27. The method of claim 23, wherein forming said P-doped layer of silicon material comprises performing at least one ion implantation process with a P-type dopant material to form said P-doped layer of silicon material.

28. The method of claim 23, wherein forming said N-doped silicon cathode in said active layer comprises performing at least one ion implantation process with an N-type dopant material to form said N-doped silicon cathode.

29. The method of claim 23, wherein forming said N-type layer of silicon germanium material in said trench comprises performing an epitaxial growth process to form said N-type layer of silicon germanium material comprising approximately 10-25% germanium in said trench.

30. The method of claim 23, wherein the P-doped layer comprises silicon germanium.

31. A method of forming a diode in a bulk semiconducting substrate, the method comprising:
forming an N-well in said bulk semiconducting substrate;
forming an isolation structure in said bulk semiconducting substrate in an area within said N-well;
etching a trench into said bulk semiconducting substrate adjacent said isolation structure;
forming a P-doped anode by:
forming an N-type layer of silicon germanium material in said trench; and
forming a P-doped layer comprising silicon material in said trench above said N-type layer of silicon germanium material;
forming an N-doped silicon cathode in said bulk semiconducting substrate adjacent said isolation structure in an area within said N-well; and
forming a conductive contact to each of said anode and cathode.

32. The method of claim 31, further comprising forming a metal silicide layer on each of said anode and cathode prior to forming said conductive contacts.

33. The method of claim 31, wherein forming said N-type layer of silicon germanium material in said trench comprises epitaxially growing said N-type layer of silicon germanium material in said trench.

34. The method of claim 31, wherein forming said N-doped silicon cathode in said active layer comprises performing at least one ion implantation process with an N-type dopant material to form said N-doped silicon cathode.

35. The method of claim 31, wherein forming said N-type layer of silicon germanium material in said trench comprises performing an epitaxial growth process to form said N-type silicon germanium material comprising approximately 10-25% germanium.

36. The method of claim 31, wherein said N-type layer of silicon germanium material has a thickness that is less than a depth of said trench.

37. The method of claim 31, wherein the P-doped layer comprises silicon germanium.

\* \* \* \* \*

UNITED STATES PATENT AND TRADEMARK OFFICE
CERTIFICATE OF CORRECTION

| | | |
|---|---|---|
| PATENT NO. | : 7,943,471 B1 | Page 1 of 1 |
| APPLICATION NO. | : 11/383295 | |
| DATED | : May 17, 2011 | |
| INVENTOR(S) | : James F. Buller et al. | |

It is certified that error appears in the above-identified patent and that said Letters Patent is hereby corrected as shown below:

Col. 10, line 53 (claim 31, line 16), after "N-well" insert -- , wherein the n-doped layer of the anode contacts the substrate in a region not including the n-doped silicon cathode --.

Signed and Sealed this
Thirtieth Day of August, 2011

David J. Kappos
*Director of the United States Patent and Trademark Office*